(12) United States Patent
Lee

(10) Patent No.: US 8,604,824 B2
(45) Date of Patent: Dec. 10, 2013

(54) HACKING DETECTING DEVICE, INTEGRATED CIRCUIT AND METHOD OF DETECTING A HACKING ATTEMPT

(75) Inventor: Seung-won Lee, Younin-si (KR)

(73) Assignee: Samsung Electronics Co., Ltd, Suwon-si (KR)

( * ) Notice: Subject to any disclaimer, the term of this patent is extended or adjusted under 35 U.S.C. 154(b) by 0 days.

(21) Appl. No.: 13/240,031

(22) Filed: Sep. 22, 2011

(65) Prior Publication Data

US 2012/0139577 A1 Jun. 7, 2012

(30) Foreign Application Priority Data

Dec. 7, 2010 (KR) .......................... 10-2010-0123902

(51) Int. Cl.
*H03K 19/00* (2006.01)
(52) U.S. Cl.
USPC ................................................. 326/8; 257/48
(58) Field of Classification Search
USPC ................................................. 326/8; 257/48
See application file for complete search history.

(56) References Cited

U.S. PATENT DOCUMENTS

| 7,932,725 | B2 * | 4/2011 | Lee ................................ 324/522 |
| 2008/0129358 | A1 * | 6/2008 | Monma et al. ................ 327/175 |
| 2008/0309396 | A1 * | 12/2008 | Lee ................................ 327/509 |
| 2010/0020648 | A1 * | 1/2010 | La Rosa ........................ 368/107 |
| 2011/0007567 | A1 * | 1/2011 | Modave et al. ........... 365/185.04 |

FOREIGN PATENT DOCUMENTS

| JP | 2002-22793 | 1/2002 |
| JP | 2007-298306 | 11/2007 |
| JP | 4211507 | 11/2008 |

OTHER PUBLICATIONS

Reto Zimmermann and Wolfgang Fichtner, Low-Power Logic Styles: CMOS Versus Pass—Transistor Logic, Jul. 1997, IEEE Journal of Solid State Circuits, vol. 32 No. 7, 1079-1090.*

* cited by examiner

*Primary Examiner* — Jason M Crawford

(74) *Attorney, Agent, or Firm* — Stanzione & Kim, LLP

(57) ABSTRACT

A hacking detecting device includes a metal line capacitor, a charge providing unit, a charge storing unit and a hacking deciding unit. The metal line capacitor has a first metal line and a second metal line. The charge providing unit periodically charges the metal line capacitor. The charge storing unit accumulates charges periodically stored in the metal line capacitor, and generates an output voltage corresponding to an amount of the accumulated charges. The hacking deciding unit determines whether the metal line capacitor is exposed based on the output voltage of the charge storing unit.

20 Claims, 15 Drawing Sheets

HACKING DETECTING DEVICE, INTEGRATED CIRCUIT AND METHOD OF DETECTING A HACKING ATTEMPT

CROSS-REFERENCE TO RELATED APPLICATIONS

This U.S. non-provisional application claims the benefit of priority under 35 U.S.C. §119 to Korean Patent Application No. 2010-0123902 filed on Dec. 7, 2010 in the Korean Intellectual Property Office (KIPO), the entire content of which is incorporated herein by reference in its entirety.

BACKGROUND OF THE INVENTION

1. Field of the Invention

Example embodiments relate to semiconductor devices. More particularly, example embodiments relate to hacking detecting devices, integrated circuits and methods of detecting hacking attempts.

2. Description of the Related Art

An integrated circuit (IC) card, such as a smart card, is capable of performing a bidirectional communication, protection of information, etc., and thus the IC card has been widely used in various applications, such as online banking, automated teller machine, subscription television, mobile phone, etc. An integrated circuit included in the IC card, such as a smart card chip, a microcontroller, a microprocessor, etc., may process data that need to be protected, such as a cryptographic key, sensitive data, etc., and thus protection for the integrated circuit is required.

An unauthorized access (e.g., tampering) has been attempted in various ways to extract data from the integrated circuit. For example, an invasive attack may measure a signal processed in the integrated circuit by de-packaging a chip package and by physically or chemically removing a passivation layer or forming a hole through the passivation layer.

SUMMARY OF THE INVENTION

Some example embodiments provide a hacking detecting device capable of exactly detecting a hacking attempt.

Some example embodiments provide an integrated circuit including a hacking detecting device capable of exactly detecting a hacking attempt.

Some example embodiments provide a method of detecting a hacking attempt.

Additional aspects and advantages of the present general inventive concept will be set forth in part in the description which follows and, in part, will be obvious from the description, or may be learned by practice of the general inventive concept.

The foregoing and/other aspects and utilities of the present general inventive concept may be achieved by proving a hacking detecting device which may include a metal line capacitor, a charge providing unit, a charge storing unit and a hacking deciding unit. The metal line capacitor has a first metal line and a second metal line. The charge providing unit periodically charges the metal line capacitor. The charge storing unit accumulates charges periodically stored in the metal line capacitor, and generates an output voltage corresponding to an amount of the accumulated charges. The hacking deciding unit determines whether the metal line capacitor is exposed based on the output voltage of the charge storing unit.

The first metal line and the second metal line may be formed in one layer of a plurality of layers included in an integrated circuit.

The one layer where the first metal line and the second metal line are formed may be an uppermost layer among the plurality of layers.

The first metal line and the second metal line may be two adjacent metal lines among a plurality of metal lines included in the one layer.

The charge providing unit may include a switch configured to periodically couple a first internal power supply voltage to the metal line capacitor in response to a clock signal.

The switch may include a gate to which the clock signal is applied, a drain coupled to the first internal power supply voltage, and a source coupled to the first metal line.

The charge providing unit may further include an inverter configured to periodically boost a voltage of the metal line capacitor by inverting the clock signal.

The inverter may include a PMOS transistor including a gate to which the clock signal is applied, a source coupled to the first internal power supply voltage, and a drain coupled to the second metal line, and an NMOS transistor including a gate to which the clock signal is applied, a source coupled to a second internal power supply voltage, and a drain coupled to the second metal line.

The charge storing unit may include an accumulating capacitor configured to accumulate the charges periodically stored in the metal line capacitor, a transfer switch configured to periodically couple the metal line capacitor to the accumulating capacitor in response to an inverted clock signal, and a reset switch configured to discharge the accumulating capacitor in response to a reset signal.

One end of the accumulating capacitor may be coupled to the first metal line via the transfer switch, and the other end of the accumulating capacitor may be coupled to a second internal power supply voltage.

The accumulating capacitor may be a transistor capacitor.

The accumulating capacitor may include an NMOS transistor including a gate coupled to the first metal line via the transfer transistor, a drain coupled to a second internal power supply voltage, and a source coupled to the second internal power supply voltage.

A capacitance of the accumulating capacitor may be greater than a capacitance of the metal line capacitor.

The transfer switch may include a PMOS transistor including a gate to which the inverted clock signal is applied, the PMOS transistor coupled between the metal line capacitor and the accumulating capacitor, and an NMOS transistor including a gate to which a clock signal is applied, the NMOS transistor coupled in parallel with the PMOS transistor between the metal line capacitor and the accumulating capacitor.

The reset switch may include an NMOS transistor including a gate to which the reset signal is applied, a drain coupled to the accumulating capacitor, and a source coupled to a second internal power supply voltage.

The hacking deciding unit may include an inverter configured to generate a detection signal by inverting the output voltage.

The inverter may generate the detection signal indicating that the metal line capacitor is not exposed if the output voltage is higher than or equal to a predetermined voltage, and may generate the detection signal indicating that the metal line capacitor is exposed if the output voltage is lower than the predetermined voltage.

The hacking deciding unit may include a comparator configured to generate a detection signal by comparing the output voltage with a reference voltage.

The comparator may generate the detection signal indicating that the metal line capacitor is not exposed if the output voltage is higher than or equal to the reference voltage, and may generate the detection signal indicating that the metal line capacitor is exposed if the output voltage is lower than the reference voltage.

The charge providing unit, the charge storing unit and the hacking deciding unit may be formed using a CMOS process.

The foregoing and/other aspects and utilities of the present general inventive concept may also be achieved by proving an integrated circuit which may include a hacking detecting device and a processor. The hacking detecting device periodically charges a metal line capacitor having a first metal line and a second metal line, accumulates charges periodically stored in the metal line capacitor, and generates a detection signal by determining whether the metal line capacitor is exposed based on an amount of the accumulated charges. The processor is reset in response to the detection signal.

The hacking detecting device may be formed in a standard cell region of the integrated circuit.

The first metal line and the second metal line may be arranged in parallel or perpendicular to metal lines formed in the standard cell region, and each of the first metal line and the second metal line may have a width substantially the same as a width of each of the metal lines formed in the standard cell region.

The integrated circuit may be implemented as a smart card chip.

The foregoing and/other aspects and utilities of the present general inventive concept may also be achieved by proving a method of detecting a hacking attempt according to a charge in a metal line capacitor having a first metal line and a second metal lined. Charges periodically stored in the metal line capacitor are accumulated. Whether the metal line capacitor is exposed is determined based on an amount of the accumulated charges.

A voltage of the metal line capacitor may be periodically boosted.

The foregoing and/other aspects and utilities of the present general inventive concept may also be achieved by proving a hacking detecting device including a metal line capacitor, a charge providing unit to periodically charge the metal line capacitor, and a detection unit connected to the metal line capacitor to detect a characteristic of the metal line capacitor according to a plurality of periodic charges of the metal line capacitor.

The charge providing unit may alternately charge and discharge the metal line capacitor so that the plurality of periodic charges are output from the metal line capacitor to the detection unit.

The charge providing unit may repeat supplying a potential to the metal line capacitor and terminating the supply of the potential, and the detection unit may receive the plurality of periodic charges when the charge providing unit terminates the supply of the potential to the metal line capacitor.

The detection unit may accumulate the plurality of periodic charges to determine the characteristic of the metal line capacitor according to the accumulated periodic charges.

The detection unit may receive a first set of the plurality of periodic charges and periodically resets the received first set of the plurality of periodic charges to receive a second set of the plurality of periodic charges.

The charge providing unit may periodically charge the metal line capacitor for each of a plurality of periods, and the detection unit may detect the characteristic of the metal line capacitor between the periods.

The metal line capacitor may include a first metal line, a second metal line, and a structure disposed between the first metal line and the second metal line. The plurality of periodic charges may be variable according to a change of the structure of the metal line capacitor with respect to a time axis.

The metal line capacitor may include a first metal line, a second metal line, and a structure disposed between the first metal line and the second metal line, and a set of the plurality of periodic charges may represent a pattern different from a reference pattern. The detection unit may determine the characteristic as a hacking according to the pattern and the reference pattern.

The foregoing and/other aspects and utilities of the present general inventive concept may also be achieved by proving an integrated circuit including a plurality of metal line capacitors, a charge providing unit to periodically charge one of the metal line capacitors, and a detection unit connected to the one metal line capacitor to detect a characteristic change of the one metal line capacitor according to a plurality of periodic charges of the one metal line capacitor.

The plurality of metal line capacitors may have a same structure and dimension and the characteristic change corresponds to a change of the structure and dimension.

The charge providing unit may periodically charge more than two of the metal line capacitors disposed spaced apart from each other with respect to a plain of the plurality of metal line capacitors.

The detection unit may not detect the characteristic of the one metal line capacitor from the other one of the plurality of metal line capacitors.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which.

DETAILED DESCRIPTION OF THE PREFERRED EMBODIMENTS

Figure 1:
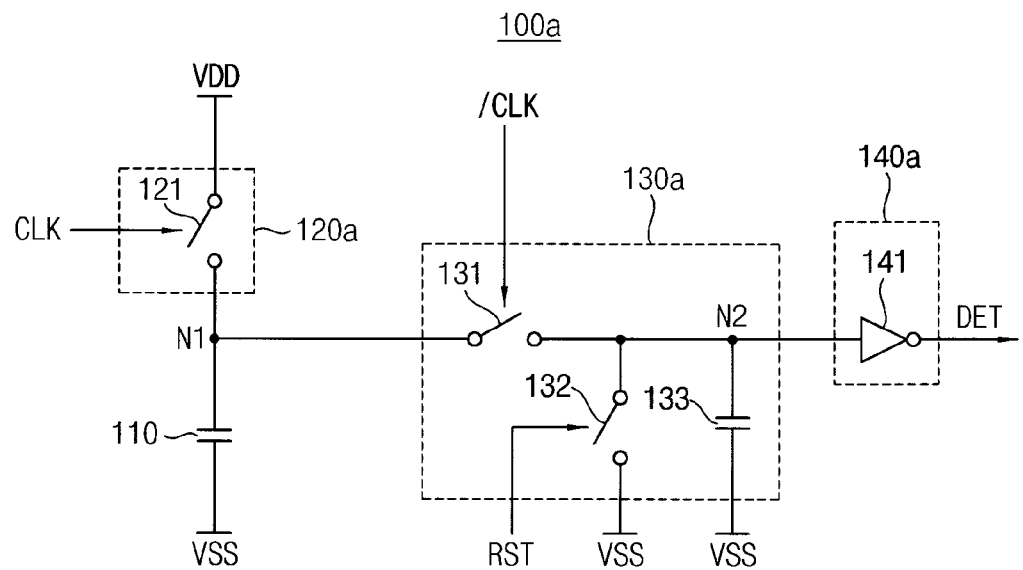
FIG. 1 is a circuit diagram illustrating a hacking detecting device according to an exemplary embodiment of the present general inventive concept.

Reference will now be made in detail to the embodiments of the present general inventive concept, examples of which are illustrated in the accompanying drawings, wherein like reference numerals refer to the like elements throughout. The embodiments are described below in order to explain the present general inventive concept while referring to the figures. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a circuit diagram illustrating a hacking detecting device 100a according to an exemplary embodiment of the preset general inventive concept.

Referring to FIG. 1, the hacking detecting device 100a includes a metal line capacitor 110, a charge providing unit 120a, a charge storing unit 130a and a hacking deciding unit 140a.

The metal line capacitor 110 includes a first metal line and a second metal line. The first metal line may be coupled to a first node N1, and the second metal line may be coupled to a second internal power supply voltage VSS (e.g., a ground voltage). It is possible that the first metal line and the second metal line may be formed in the same metal line layer, and the first metal line and the second metal line may be adjacent.

Locations of the first metal line and the second metal line and a change of a capacitance of the metal line capacitor 110 caused by a hacking attempt will be described below with reference to FIGS. 2 through 3B.

The charge providing unit 120a may periodically charge the metal line capacitor 110 in response to a clock signal CLK. The charge providing unit 120a may include a switch 121 coupled between a first internal power supply voltage VDD and the first metal line of the metal line capacitor 110. The switch 121 may receive the clock signal CLK as a switching signal, and may periodically couple the first internal power supply voltage VDD to the first metal line of the metal line capacitor 110 in response to the clock signal CLK. If the first internal power supply voltage VDD is coupled to the first metal line, the metal line capacitor 110 may store charges corresponding to a voltage difference between the first internal power supply voltage VDD and the second internal power supply voltage VSS.

The charge storing unit 130a may accumulate the charges periodically stored in the metal line capacitor 110, and may output a voltage to correspond to the accumulated charges at a second node N2. The metal line capacitor 110 may include a transfer switch 131 coupled between the first node N1 and the second node N2, a reset switch 132 coupled between the second node N2 and the second internal power supply voltage VSS, and an accumulating capacitor 133 coupled between the second node N2 and the second internal power supply voltage VSS.

One end of the accumulating capacitor 133 may be coupled to the second node N2, and the other end of the accumulating capacitor 133 may be coupled to the second internal power supply voltage VSS. The reset switch 132 may receive a reset signal RST as a switching signal, and may discharge the accumulating capacitor 133 in response to the reset signal RST. The reset signal RST may include a pulse with a predetermined period. The predetermined period of the reset signal RST may be substantially the same as a period of a hacking detection operation of the hacking detecting device 100a.

The transfer switch 131 may receive an inverted clock signal /CLK as a switching signal, and may couple the metal line capacitor 110 to the accumulating capacitor 133 in response to the inverted clock signal /CLK. Accordingly, while the clock signal CLK has a high level, the metal line capacitor 110 may be charged. While the inverted clock signal /CLK has a high level, the charges stored in the charged metal line capacitor 110 may be transferred to the accumulated capacitor 133. Such charging and transferring may be periodically repeated, and the accumulating capacitor 133 may accumulate the charges periodically stored in the metal line capacitor 110.

The hacking deciding unit 140a may determine whether the metal line capacitor 110 is exposed to an unauthorized access or attempt to damage the hacking detecting device 100a or a user thereof based on an output voltage of the charge storing unit 130a (i.e., a voltage of the second node N2). The hacking deciding unit 140a may include an inverter 141 having an input terminal coupled to the second node N2 and an output terminal outputting a detection signal DET. The inverter 141 may generate the detection signal DET by inverting the output voltage of the charge storing unit 130 (i.e., the voltage of the second node N2). The inverter 141 may generate the detection signal DET indicating that the metal line capacitor 110 is not exposed if the voltage of the second node N2 is higher than or equal to a predetermined voltage, and may generate the detection signal DET indicating that the metal line capacitor 110 is exposed if the voltage of the second node N2 is lower than the predetermined voltage. For example, the predetermined voltage may be the minimum input voltage for the inverter 141 to output a signal of a low level.

When a hacker attempts hacking, such as an invasive attack, an insulation material between the first metal line and the second metal line of the metal line capacitor 110 may be partially or entirely removed, and thus a capacitance of the metal line capacitor 110 may decrease. If the capacitance of the metal line capacitor 110 decreases, an amount of charges stored in the metal line capacitor 110 may decrease, and an amount of charges accumulated in the charge storing unit 130a may decrease. If the amount of the charges accumulated in the charge storing unit 130 decreases, the voltage of the second node N2 may decrease, and thus the voltage of the second node N2 may be lower than the minimum input voltage for the inverter 141 to output a signal of a low level. Accordingly, the inverter 141 may inform a processor (not illustrated) that the metal line capacitor 110 is exposed by outputting the detection signal DET of a high level.

As described above, the hacking detecting device 100a according to an exemplary embodiment of the present general inventive concept may detect a change of the capacitance of the metal line capacitor 110 without comparing the capacitance of the metal line capacitor 110 with a capacitance of a reference capacitor. In a case that a hacker attempts to avoid a hacking detection by simultaneously removing portions of the metal line capacitor 110 and the reference capacitor (not illustrated), it is not easy to detect the hacking attempt by a conventional hacking detecting device. However, even if a hacker attempts a hacking attack to simultaneously remove an insulation material of the metal line capacitor 110 and an insulation material of the reference capacitor, the hacking attack can be detected in an integrated circuit including the hacking detecting device 100a according to an exemplary embodiment of the present general inventive concept.

Furthermore, a hacking attempt using a focused ion beam (FIB) method on a hacking detecting device having the metal line capacitor 110 can be exactly detected according to an exemplary embodiment of the present general inventive concept. When the hacking attempt using the FIB has been done, at least one of electrodes of the reference capacitor may be removed or cut by the FIB, and thus the capacitance of the reference capacitor may be reduced. Accordingly, it is not easy to detect the hacking attempt by a conventional hacking detecting device. However, since the hacking detecting device 100a detects a dimension or characteristic change, for example, the capacitance change, of the metal line capacitor 110 without comparison of the metal line capacitor 110 and the reference capacitor, the hacking attempt using the FIB can be detected in an integrated circuit including the hacking detecting device 100a according to an exemplary embodiment of the present general inventive concept.

In the hacking detecting device 100a according to an exemplary embodiment of the present general inventive concept, the charge providing unit 120a, the charge storing unit 130a and the hacking deciding unit 140a may be formed using a typical complementary metal-oxide semiconductor (CMOS) standard cell process. Further, the first internal power supply voltage VDD and the second internal power supply voltage VSS may be internal power supply voltages of the integrated circuit including the hacking detecting device 100a, and, for example, may be power supply voltages provided to a standard cell region of the integrated circuit. Accordingly, it is not easy for a hacker to know a location of the hacking detecting device 100a, and the hacking detecting device 100a may have a small size, compared to a conventional hacking detecting device.

Further, although the metal line capacitor 110 has a small size and a low capacitance, the hacking detecting device 100a according to an exemplary embodiment of the present general inventive concept may exactly detect a hacking attempt by a hacker since the metal line capacitor 110 is repeatedly charged.

Figure 2:
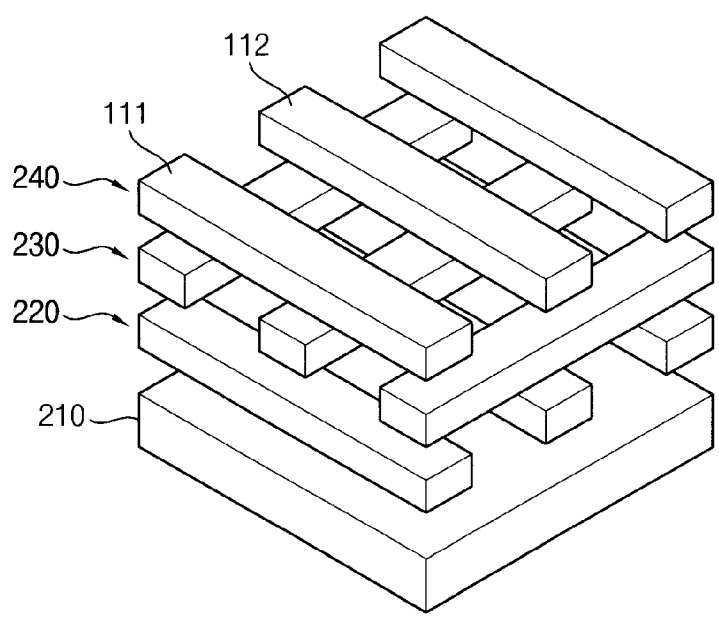
FIG. 2 is a perspective view of an integrated circuit including a hacking detecting device of FIG. 1.

FIG. 2 is a perspective view illustrating an integrated circuit 200 including the hacking detecting device 100a of FIG. 1.

Referring to FIGS. 1 and 2, the integrated circuit 200 includes a substrate 210 and first through third metal line layers 220, 230 and 240. Although FIG. 2 illustrates an example where three metal line layers 220, 230 and 240 are formed in the integrated circuit 200, one or more metal line layers may be formed in the integrated circuit 200.

At least one hacking detecting device 100a may be formed in an integrated circuit 200. A charge providing unit 120a, a charge storing unit 130a and a hacking deciding unit 140a of the hacking detecting device 100a may be formed in the substrate 210. Further, any two of metal lines included in the metal line layers 220, 230 and 240 may be used as a first electrode and a second electrode of a metal line capacitor 110.

It is possible that two metal lines used as the first electrode and the second electrode of the metal line capacitor 110 may be included in the same metal line layer. For example, any two of metal lines included in the third metal line layer 240 may be used as the first electrode and the second electrode of the metal line capacitor 110. In some embodiments, two adjacent metal lines 111 and 112 may be used as the first electrode and the second electrode, respectively. For example, the metal line capacitor 110 including the two adjacent metal lines 112 and 112 may have a capacitance from about 3 fF to about 4 fF.

The metal lines used as the first electrode and the second electrode may be included in the uppermost metal line layer 240 among the metal line layers 220, 230 and 240. Accordingly, the hacking detection device 100a may effectively detect a hacking attempt.

Figure 3A:
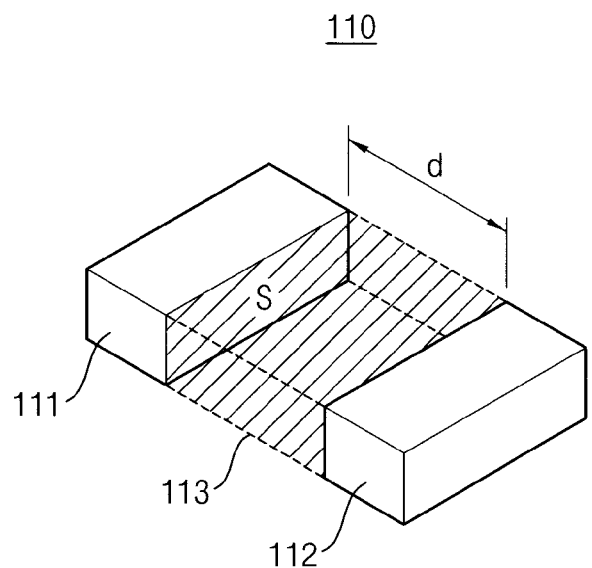
FIGS. 3A and 3B are diagrams illustrating a metal line capacitor before hacking is attempted and after hacking is attempted, respectively, according to an exemplary embodiment of the present general inventive concept.
Figure 3B:
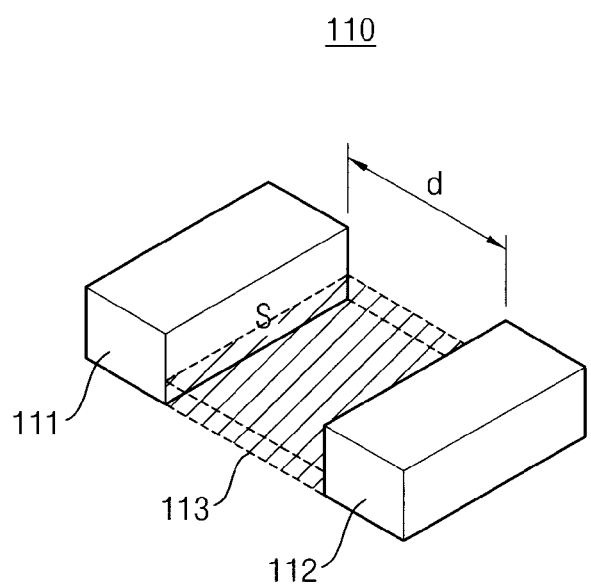

FIGS. 3A and 3B are diagrams illustrating a metal line capacitor before hacking is attempted and after hacking is attempted, respectively.

Referring to FIG. 3A, an insulation material 113 may be formed between a first metal line 111 and a second metal line 112 of a metal line capacitor 110. For example, the insulation material 113 may include a silicon oxide, a silicon nitride, etc.

A hacker may bring a probe or a microprobe into contact with one or more metal lines included in metal line layers 220, 230 and 240 illustrated in FIG. 2 to measure signals transferred through the metal line layers 220, 230 and 240. When the probe or the microprobe is into contact with the metal lines, the insulation material 113 between the metal lines can be partially or entirely removed, or holes can be formed through the insulation material 113. It is possible that a structure of the insulation material 113 or the metal line capacitor 110 can be deformed or changed.

For example, as illustrated in FIG. 3B, the insulation material 113 between the first metal line 111 and the second metal line 112 may be partially removed to form the contact. A capacitance of the metal line capacitor 110 may be calculated using an equation, "$C = \epsilon S/d$", where C represents a capacitance of the metal line capacitor 110, $\epsilon$ represents a permittivity of the insulation material 113, S represents a size of an area where the first metal line 111 and the second metal line 112 overlap each other, and d represents an interval between the first metal line 111 and the second metal line 112. If the insulation material 113 is removed, an average permittivity of a space or a material between the first metal line 111 and the second metal line 112 may decrease, and thus the capacitance of the metal line capacitor 110 may decrease.

The hacking detecting device 100a of FIG. 1 according to an exemplary embodiment of the present general inventive concept may determine whether the metal line capacitor 110 is exposed to an outside thereof by detecting the decrease of the capacitance of the metal line capacitor 110 due to a hacking attempt. Accordingly, the integrated circuit 200 can be protected from a hacking attack by detecting the hacking attempt by a hacker.

Since the metal line capacitor 110 of the integrated circuit 200 can be damaged, deformed, or changed in characteristic, capacitance, dimension (shape, area or height), etc., a device having the hacking detecting device 100a or the integrated circuit 200 can detect the hacking attempt and damage thereon as described above.

Figure 4:
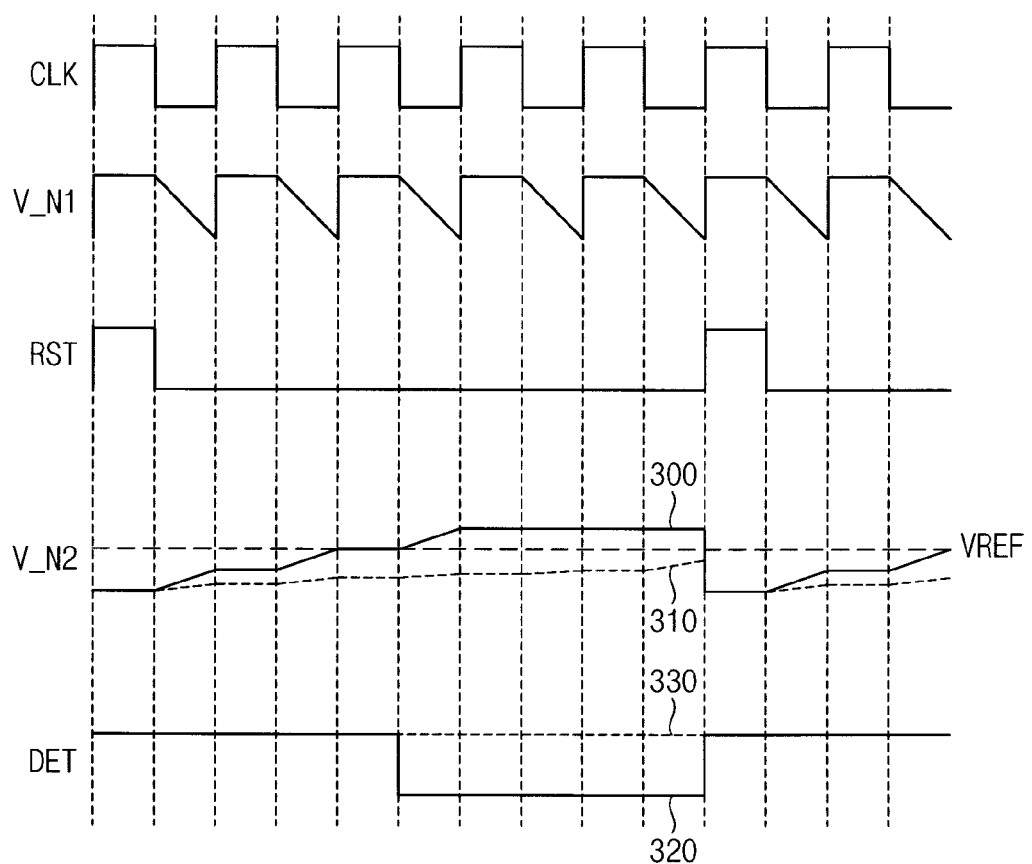
FIG. 4 is a timing diagram illustrating an operation of the hacking detecting device of FIG. 1.

FIG. 4 is a timing diagram illustrating an operation of the hacking detecting device 100a of FIG. 1.

Referring to FIGS. 1 and 4, a clock signal CLK may periodically transition from a high level to a low level or from a low level to a high level. While the clock signal CLK has a high level, a switch 121 of a charge providing unit 120a may be turned on, and a first internal power supply voltage VDD may be coupled to a first metal line of a metal line capacitor 110. Accordingly, the metal line capacitor 110 may store charges corresponding to a voltage difference between the first internal power supply voltage VDD and a second internal power supply voltage VSS.

While the clock signal CLK has a low level, the switch 121 of the charge providing unit 120a may be turned off, and a transfer switch 131 of a charge storing unit 130 may be turned on. If the transfer switch 131 is turned on, the metal line capacitor 110 may be coupled to an accumulating capacitor 133 of the charge storing unit 130. Accordingly, the charges stored in the metal line capacitor 110 may be transferred from the metal line capacitor 110 having a relatively high voltage V_N1 to the accumulating capacitor 110 having a relatively low voltage V_N2.

Such charging and transferring may be repeated in response to the periodic clock signal CLK. A reset switch 132 of the charge storing unit 130 may discharge the accumulating capacitor 133 in response to a reset signal RST with a predetermined period. The predetermined period of the reset signal RST may correspond to a period of a hacking detecting operation of a hacking detecting device 100a.

In a case where a hacking attempt by a hacker does not exist, a predetermined amount of charges may be accumulated in the accumulating capacitor 133, and a voltage V_N2 of a second node N2 may have a voltage level 300 higher than that of a predetermined voltage VREF (e.g., the minimum input voltage for an inverter 141 to output a signal of a low level). Accordingly, the inverter 141 of a hacking deciding unit 140a may output a detection signal DET of a low level 320, which indicates that the metal line capacitor 110 is not exposed.

In a case where a hacking attempt by a hacker exists, a capacitance of the metal line capacitor 110 may decrease. Accordingly, the amount of the charges stored in the metal line capacitor 110 in each cycle of the clock signal CLK may decrease, and thus the amount of the charges accumulated in the accumulating capacitor 133 may decrease. The voltage V_N2 of the second node N2 may have a voltage level 310 lower than that of the predetermined voltage VREF. Accordingly, the inverter 141 of the hacking deciding unit 140a may output the detection signal DET of a high level 330, which indicates that the metal line capacitor 110 is exposed.

As described above, the hacking detecting device 100a according to example embodiments may detect a hacking attempt by a hacker by detecting a change of the capacitance of the metal line capacitor 110.

Although FIG. 4 illustrates an example where the hacking detecting operation is performed every five cycles of the clock signal CLK, the period of the hacking detecting operation may correspond to the various numbers of clock cycles.

Figure 5A:
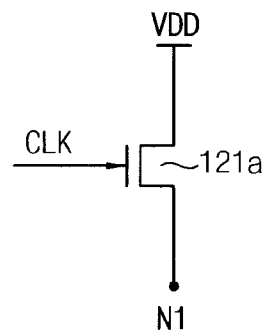
FIGS. 5A through 5C are circuit diagrams illustrating examples of a switch included in a charge providing unit of the hacking detecting device of FIG. 1.
Figure 5B:
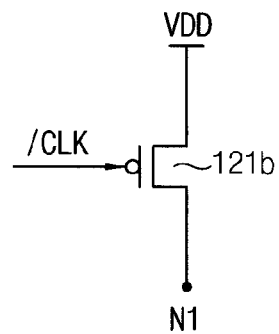
Figure 5C:
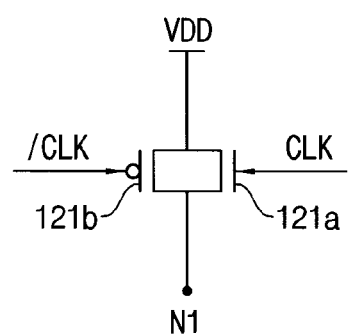

FIGS. 5A through 5C are circuit diagrams illustrating the switch 121 included in the charge providing unit 120a of the hacking detecting device 100a of FIG. 1.

Referring to FIGS. 1 and 5A, a switch 121 of the charge providing unit 120a may include an NMOS transistor 121a. The NMOS transistor 121a may include a gate to which a clock signal CLK is applied, a drain coupled to a first internal power supply voltage VDD, and a source coupled to a first node N1. The NMOS transistor 121a may couple the first internal power supply voltage VDD to the first node N1 while the clock signal CLK has a high level.

Referring to FIGS. 1 and 5B, a switch 121 of the charge providing unit 120a may include a PMOS transistor 121b. The PMOS transistor 121b may include a gate to which an inverted clock signal /CLK is applied, a source coupled to a first internal power supply voltage VDD, and a drain coupled to a first node N1. The PMOS transistor 121b may couple the first internal power supply voltage VDD to the first node N1 while the inverted clock signal /CLK has a low level.

Referring to FIGS. 1 and 5C, a switch 121 of the charge providing unit 120a may include an NMOS transistor 121a and a PMOS transistor 121b. The NMOS transistor 121a may include a gate to which a clock signal CLK is applied, a drain coupled to a first internal power supply voltage VDD, and a source coupled to a first node N1. The PMOS transistor 121b may include a gate to which an inverted clock signal /CLK is applied, a source coupled to a first internal power supply voltage VDD, and a drain coupled to a first node N1. The NMOS transistor 121a and the PMOS transistor 121b may couple the first internal power supply voltage VDD to the first node N1 while the clock signal CLK has a high level and the inverted clock signal /CLK has a low level.

As illustrated in FIGS. 5A through 5C, the switch 121 of the charge providing unit 120a may be implemented by an NMOS transistor 121a and/or a PMOS transistor 121b using a typical CMOS process.

Figure 6:
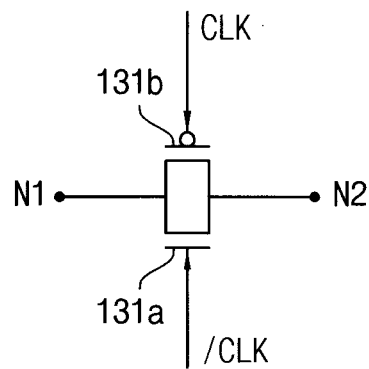
FIG. 6 is a circuit diagram illustrating an example of a transfer switch included in a charge storing unit of the hacking detecting device of FIG. 1.

FIG. 6 is a circuit diagram illustrating the transfer switch 131 included in the charge storing unit 130a of FIG. 1.

Referring to FIGS. 1 and 6, the transfer switch 131 of the charge storing unit 130a may include an NMOS transistor 131a and a PMOS transistor 131b. The NMOS transistor 131a may include a gate to which an inverted clock signal /CLK is applied, and a drain and a source coupled to a first node N1 and a second node N2, respectively. The PMOS transistor 131b may include a gate to which a clock signal CLK is applied, and a source and a drain coupled to the first node N1 and the second node N2, respectively. The NMOS transistor 131a and the PMOS transistor 131b may couple the first node N1 to the second node N2 while the clock signal CLK has a low level and the inverted clock signal /CLK has a high level.

Although FIG. 6 illustrates an example where the transfer transistor 131 includes the NMOS transistor 131a and the PMOS transistor 131b, it is possible that the transfer transistor 131 may include one of the NMOS transistor 131a and the PMOS transistor 131b. In this case, a gate of the one of the NMOS transistor 131a and the PMOS transistor 131b is connected to an inverted clock signal /CLK or a clock signal CLK according to the switch 121, and a drain and a source can be connected to the node N1 and the node N2, respectively, so that charges of the metal line capacitor 110 is transferred to the accumulating capacitor 133.

As illustrated in FIG. 6, the transfer switch 131 of the charge storing unit 130a may be implemented by an NMOS transistor 131a and/or a PMOS transistor 131b using a typical CMOS process.

Figure 7:
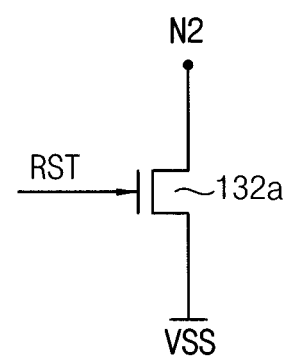
FIG. 7 is a circuit diagram illustrating an example of a reset switch included in a charge storing unit of the hacking detecting device of FIG. 1.

FIG. 7 is a circuit diagram illustrating an example of the reset switch 132 included in the charge storing unit 130a of FIG. 1.

Referring to FIGS. 1 and 7, the reset transistor 132 of the charge storing unit 130a may include an NMOS transistor 132a. The NMOS transistor 132a may include a gate to which a reset signal RST is applied, a drain coupled to a second node N2, and a source coupled to a second internal power supply voltage VSS. The NMOS transistor 132a may couple the second internal power supply voltage VSS to the second node N2 while the reset signal RST has a high level.

Although FIG. 7 illustrates an example where the reset transistor 132 includes the NMOS transistor 132a, it is possible that the reset transistor 132 may include a PMOS transistor along with or instead of the NMOS transistor 132a.

As illustrated in FIG. 7, the reset switch 132 of the charge storing unit 130a may be implemented by an NMOS transistor 132a and/or a PMOS transistor using a typical CMOS process, according to the transfer switch 131.

Figure 8:
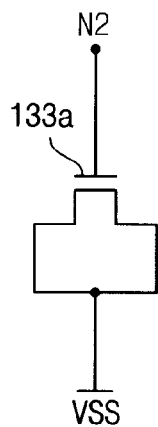
FIG. 8 is a circuit diagram illustrating an example of an accumulating capacitor included in a charge storing unit of the hacking detecting device of FIG. 1.

FIG. 8 is a circuit diagram illustrating an example of the accumulating capacitor 133 included in the charge storing unit 130a of FIG. 1.

Referring to FIGS. 1 and 8, the accumulating capacitor 133 of the charge storing unit 130a may include a transistor capacitor. The transistor capacitor may be an NMOS transistor 133a including a gate coupled to a second node N2, a drain coupled to a second internal power supply voltage VSS, and a source coupled to the second internal power supply voltage VSS. The transistor capacitor implemented by the NMOS transistor 133a may have a capacitance greater than that of a metal line capacitor 110 illustrated in FIG. 1. For example, the transistor capacitor implemented by the NMOS transistor 133a may have a capacitance of about 30 fF.

Although FIG. 8 illustrates an example where the accumulating capacitor 133 includes the NMOS transistor 133a, it is possible that the accumulating capacitor 133 may include a PMOS transistor along with or instead of the NMOS transistor 133a.

As illustrated in FIG. 8, the accumulating capacitor 133 of the charge storing unit 130a may be implemented by an NMOS transistor 133a and/or a PMOS transistor using a typical CMOS process.

Figure 9:
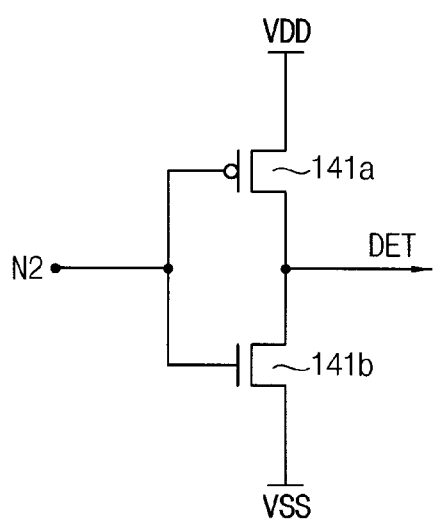
FIG. 9 is a circuit diagram illustrating an example of an inverter included in a hacking deciding unit of the hacking detecting device of FIG. 1.

FIG. 9 is a circuit diagram illustrating an example of the 141 inverter included in the hacking deciding unit 140a of FIG. 1.

Referring to FIGS. 1 and 9, the inverter 141 of the hacking deciding unit 140a may include a PMOS transistor 141a and an NMOS transistor 141b. The PMOS transistor 141a may include a gate coupled to a second node N2, a source coupled to a first internal power supply voltage VDD, and a drain coupled to an output terminal where a detection signal DET is output. The NMOS transistor 141b may include a gate coupled to the second node N2, a source coupled to a second internal power supply voltage VSS, and a drain coupled to the output terminal where the detection signal DET is output.

Although FIG. 9 illustrates an example where the inverter 141 includes the PMOS transistor 141a and the NMOS transistor 141b, it is possible that the inverter 141 may include one of PMOS transistor 141a and the NMOS transistor 141b according to the transfer switch 131 and/or the reset switch 132.

As illustrated in FIG. 9, the inverter 141 of the hacking deciding unit 140a may be implemented by a PMOS transistor 141a and/or an NMOS transistor 141b using a typical CMOS process.

As described above, a charge providing unit 120a, a charge storing unit 130a and a hacking detecting unit 140a illustrated in FIG. 1 may be formed using a typical CMOS standard cell process, and may be disposed in a standard cell region. Accordingly, it is not easy for a hacker to know a location of the hacking detecting device 100a of FIG. 1, and the hacking detecting device 100a may have a small size, compared to a conventional device.

Figure 10:
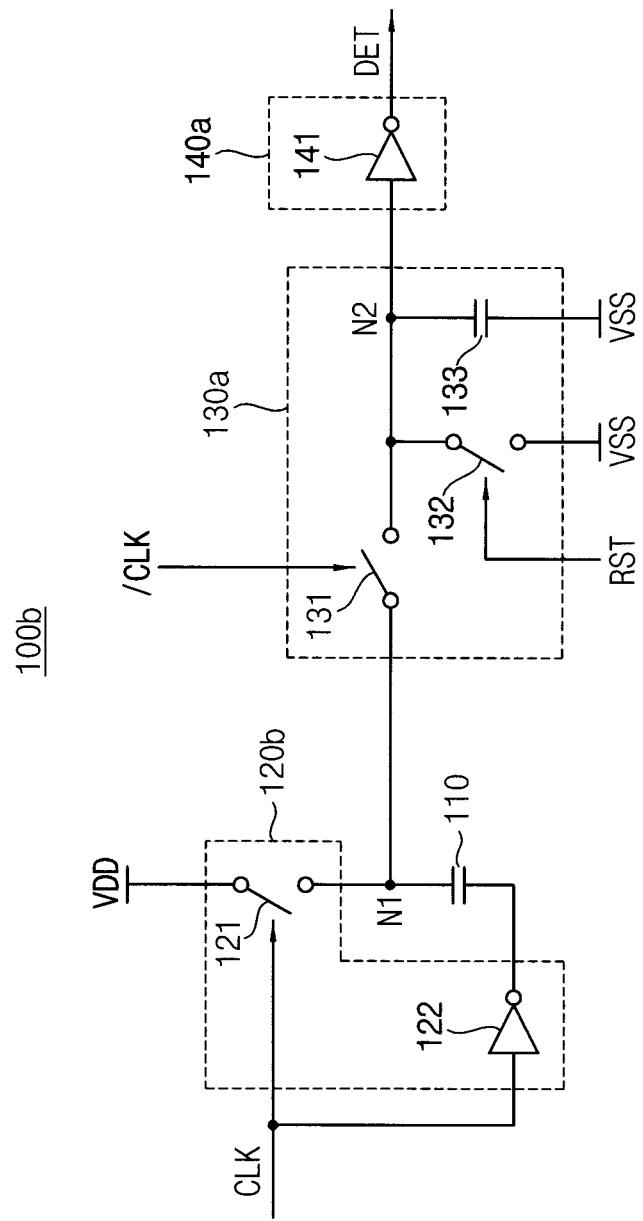
FIG. 10 is a circuit diagram illustrating a hacking detecting device according to an exemplary embodiment of the present general inventive concept.

FIG. 10 is a circuit diagram illustrating a hacking detecting device 100b according to an exemplary embodiment of the present general inventive concept.

Referring to FIG. 10, the hacking detecting device 100b may include a metal line capacitor 110, a charge providing unit 120b, a charge storing unit 130a and a hacking deciding unit 140a. The hacking detecting device 100b of FIG. 10 may have a configuration substantially similar to that of the hacking detecting device 100a of FIG. 1 except a configuration of the charge providing unit 120b.

The metal line capacitor 110 includes a first metal line and a second metal line. The first metal line may be coupled to a first node N1, and the second metal line may be coupled to an output terminal of an inverter 122 included in the charge providing unit 120b.

The charge providing unit 120b may periodically charge the metal line capacitor 110 in response to a clock signal CLK, and may periodically boost a voltage of the metal line capacitor 110 by inverting the clock signal CLK. The charge providing unit 120b may include a switch 121 and the inverter 122.

The switch 121 may receive the clock signal CLK as a switching signal, and may periodically couple a first internal power supply voltage VDD to the first metal line of the metal line capacitor 110 in response to the clock signal CLK. The inverter 122 may periodically boost the voltage of the metal line capacitor 110 by inverting the clock signal CLK.

When the clock signal CLK has a high level, the switch 121 may be turned on, and the inverter 122 may output an output voltage of a low level. Accordingly, the first internal power supply voltage VDD may be coupled to the first metal line of the metal line capacitor 110, and the metal line capacitor 110 may store charges corresponding to a voltage difference between the first internal power supply voltage VDD and the output voltage of the low level (e.g., a second internal power supply voltage VSS or a ground voltage).

When the clock signal CLK has a low level, the switch 121 may be turned off, and the inverter 122 may output an output voltage of a high level. Accordingly, a voltage of the second metal line may increase to the output voltage of the high level (e.g., the first internal power supply voltage VDD), and a voltage of the first metal line may increase to a sum of the output voltage of the high level and the voltage difference between the first internal power supply voltage VDD and the output voltage of the low level.

when the clock signal CLK has a low level, or when an inverted clock signal /CLK has a high level, a transfer transistor 131 may be turned on, and the metal line capacitor 110 may be coupled to an accumulating capacitor 133. Since the voltage of the first metal line of the metal line capacitor 110 is boosted by the inverter 122, a voltage difference between the voltage of the first metal line of the metal line capacitor 110 and a voltage of one end of the accumulating capacitor 133 may increase, and thus charge transfer from the metal line capacitor 110 to the accumulating capacitor 133 may be rapidly and efficiently performed. Accordingly, a hacking detecting operation of the hacking detecting device 100b may be rapidly and exactly performed.

Figure 11:
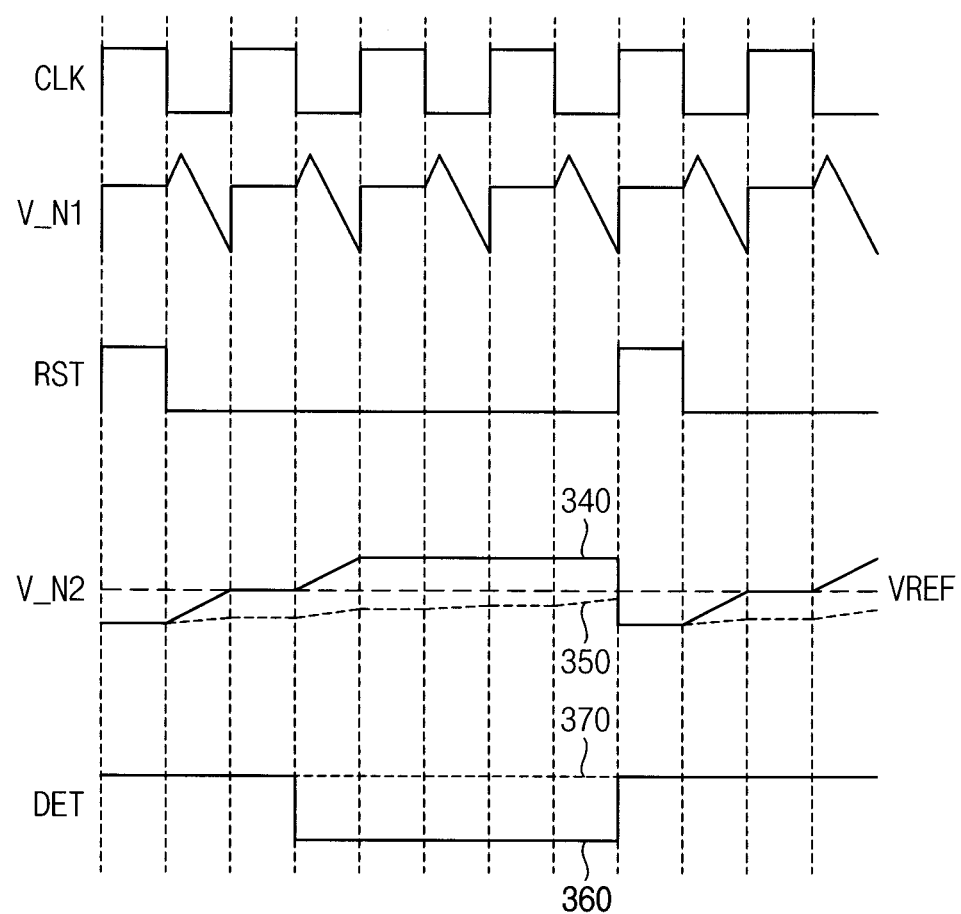
FIG. 11 is a timing diagram illustrating an operation of the hacking detecting device of FIG. 10.

FIG. 11 is a block diagram illustrating a computing system including a memory system according to an exemplary embodiment of the present general inventive concept.

Referring to FIGS. 10 and 11, a clock signal CLK may periodically transition from a high level to a low level or from a low level to a high level. While the clock signal CLK has a high level, a switch 121 of a charge providing unit 120b may be turned on, and an inverter 122 may output an output voltage of a low level. Accordingly, a first internal power supply voltage VDD may be coupled to a first metal line of a metal line capacitor 110, and the metal line capacitor 110 may store charges corresponding to a voltage difference between the first internal power supply voltage VDD and the output voltage of the low level (e.g., a second internal power supply voltage VSS or a ground voltage).

When the clock signal CLK has a low level, the switch 121 of the charge providing unit 120b may be turned off, the inverter 122 may output an output voltage of a high level, and a transfer switch 131 of a charge storing unit 130 may be turned on. Accordingly, a voltage of the metal line capacitor 110 (i.e., a voltage V_N1 of a first node N1) may be boosted, and thus the charges stored in the metal line capacitor 110 may be efficiently transferred to an accumulating capacitor 133.

Such charging and transferring may be repeated in response to the periodic clock signal CLK. A reset switch 130 of the charge storing unit 130 may discharge the accumulating capacitor 133 in response to a reset signal RST with a predetermined period.

In a case where a hacking attempt by a hacker does not exist, a voltage V_N2 of a second node N2 may have a voltage level 340 higher than that of a predetermined voltage VREF (e.g., the minimum input voltage for an inverter 141 to output a signal of a low level). Accordingly, the inverter 141 of a hacking deciding unit 140a may output a detection signal DET of a low level 360, which indicates that the metal line capacitor 110 is not exposed.

In a case where a hacking attempt by a hacker exists, the voltage V_N2 of the second node N2 may have a voltage level 350 lower than that of the predetermined voltage VREF. Accordingly, the inverter 141 of the hacking deciding unit 140a may output the detection signal DET of a high level 370, which indicates that the metal line capacitor 110 is exposed.

As described above, the hacking detecting device 100b according to an exemplary embodiment of the present general inventive concept may detect a hacking attempt by a hacker by detecting a change of a capacitance of the metal line capacitor 110.

Figure 12:
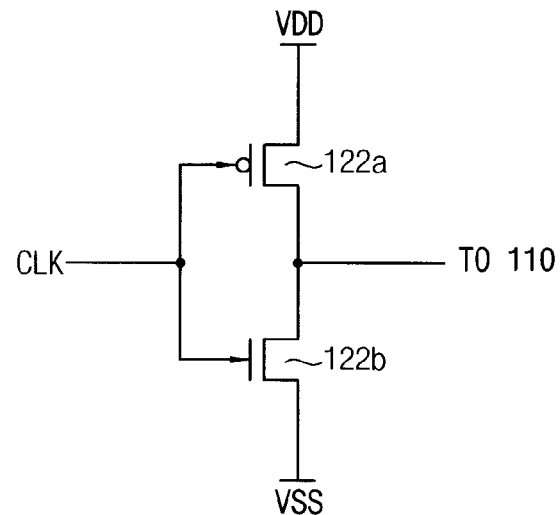
FIG. 12 is a circuit diagram illustrating an example of an inverter included in a charge providing unit of the hacking detecting device of FIG. 10.

FIG. 12 is a circuit diagram illustrating an example of the 122 inverter included in the charge providing unit 120b of FIG. 10.

Referring to FIGS. 10 and 12, the inverter 122 of the charge providing unit 120b may include a PMOS transistor 122a and an NMOS transistor 122b. The PMOS transistor 122a may include a gate to which a clock signal CLK is applied, a source coupled to a first internal power supply voltage VDD, and a drain coupled to a second metal line of a metal line capacitor 110. The NMOS transistor 122b may include a gate to which the clock signal CLK is applied, a source coupled to a second internal power supply voltage VSS, and a drain coupled to the second metal line of the metal line capacitor 110.

Although FIG. 12 illustrates an example where the inverter 122 includes the PMOS transistor 122a and the NMOS transistor 122b, it is possible that the inverter 122 may include one of the PMOS transistor 122a and the NMOS transistor 122b according to the switch 121.

As illustrated in FIG. 12, the inverter 122 of the charge providing unit 120b may be implemented by a PMOS transistor 122a and/or an NMOS transistor 122b using a typical CMOS process.

Figure 13:
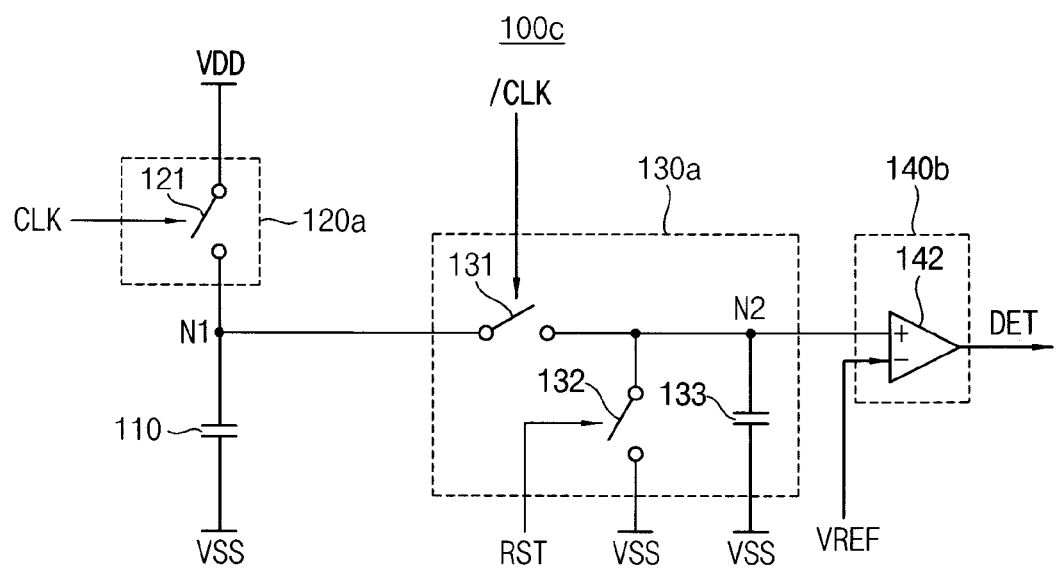
FIG. 13 is a circuit diagram illustrating a hacking detecting device according to an exemplary embodiment of the present general inventive concept.

FIG. 13 is a circuit diagram illustrating a hacking detecting device 100c according to an exemplary embodiment of the present general inventive concept.

Referring to FIG. 13, the hacking detecting device 100c may include a metal line capacitor 110, a charge providing unit 120a, a charge storing unit 130a and a hacking deciding unit 140b. The hacking detecting device 100c of FIG. 13 may have a configuration substantially similar to that of the hacking detecting device 100a of FIG. 1 except a configuration of the hacking deciding unit 140b. It is possible that the hacking detecting device 100c of FIG. 13 may include a charge providing unit 120b illustrated in FIG. 10 instead of the charge providing unit 120a.

The charge providing unit 120a may periodically charge a metal line capacitor 110 in response to a clock signal CLK. The charge storing unit 130 may accumulate charges periodically stored in the metal line capacitor 110, and may output a voltage corresponding to an amount of the accumulated charges at a second node N2.

The hacking deciding unit 140b may determine whether the metal line capacitor 110 is exposed based on an output voltage of the charge storing unit 130, or the voltage of the second node N2. The hacking deciding unit 140b may include a comparator 142.

The comparator 142 may include a first input terminal to receive the output voltage of the charge storing unit 130, a second input terminal to receive a reference voltage VREF, and an output terminal to output a detection signal DET. The comparator 142 may generate the detection signal DET indicating that the metal line capacitor 110 is not exposed if the output voltage of the charge storing unit 130 is higher than or equal to the reference voltage VREF, and may generate the detection signal DET indicating that the metal line capacitor 110 is exposed if the output voltage of the charge storing unit 130 is lower than the reference voltage VREF.

Figure 14:
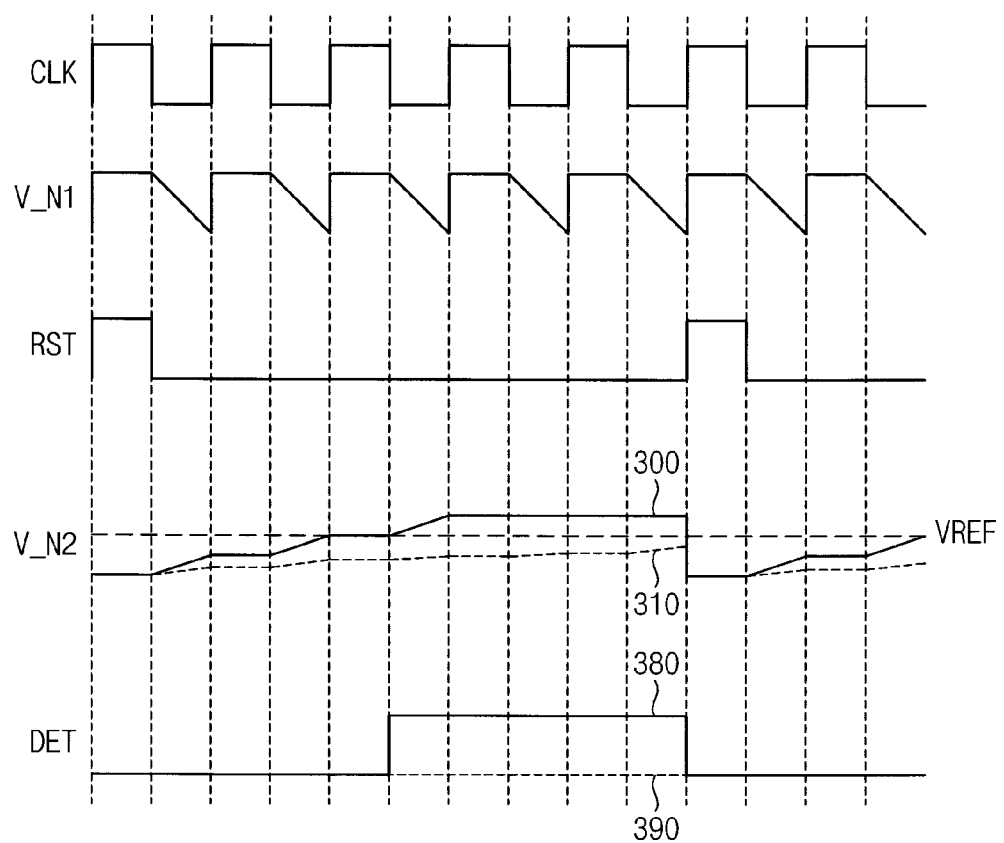
FIG. 14 is a timing diagram illustrating an operation of the hacking detecting device of FIG. 13.

FIG. 14 is a timing diagram illustrating an operation of the hacking detecting device 100c of FIG. 13.

Referring to FIGS. 13 and 14, a clock signal CLK may periodically transition from a high level to a low level or from a low level to a high level. While the clock signal CLK has a high level, a switch 121 of a charge providing unit 120a may be turned on. Accordingly, a first internal power supply voltage VDD may be coupled to a first metal line of a metal line capacitor 110, and the metal line capacitor 110 may store charges corresponding to a voltage difference between the first internal power supply voltage VDD and a second internal power supply voltage VSS.

When the clock signal CLK has a low level, the switch 121 of the charge providing unit 120a may be turned off, and a transfer switch 131 of a charge storing unit 130 may be turned on. Accordingly, the charges stored in the metal line capacitor 110 may be transferred to an accumulating capacitor 133.

Such charging and transferring may be repeated in response to the periodic clock signal CLK. A reset switch 130 of the charge storing unit 130 may discharge the accumulating capacitor 133 in response to a reset signal RST with a predetermined period.

In a case where a hacking attempt by a hacker does not exist, a voltage V_N2 of a second node N2 may have a voltage level 300 higher than that of a reference voltage VREF. Accordingly, a comparator 142 of a hacking deciding unit 140b may output a detection signal DET of a high level 380, which indicates that the metal line capacitor 110 is not exposed.

In a case where a hacking attempt by a hacker exists, the voltage V_N2 of the second node N2 may have a voltage level 310 lower than that of the reference voltage VREF. Accordingly, the comparator 142 of the hacking deciding unit 140b may output the detection signal DET of a low level 390, which indicates that the metal line capacitor 110 is exposed.

As described above, the hacking detecting device 100c according to an exemplary embodiment of the preset general inventive concept may detect a hacking attempt by a hacker by detecting a change of a capacitance of the metal line capacitor 110.

Figure 15:
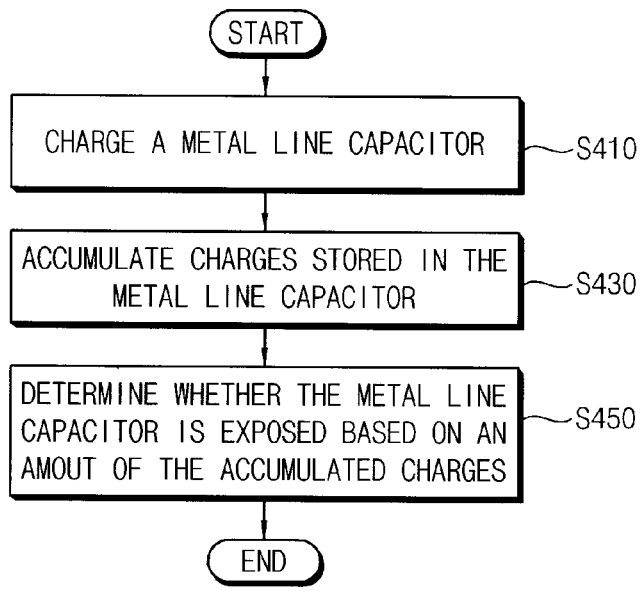
FIG. 15 is a flow chart illustrating a method of detecting a hacking attempt according to an exemplary embodiment of the present general inventive concept.

FIG. 15 is a flow chart illustrating a method of detecting a hacking attempt according to an exemplary embodiment of the present general inventive concept.

Referring to FIGS. 1, 13 and 15, a charge providing unit 120a may charge a metal line capacitor 110 in response to a clock signal CLK at operation S410.

A charge storing unit 130a may accumulate charges of the metal line capacitor 110 in an accumulating capacitor 133 by coupling the metal line capacitor 110 to the accumulating capacitor 133 in response to an inverted clock signal /CLK at operation S430.

The charge storing unit 130a may output a voltage to correspond to an amount of the charges accumulated in the accumulating capacitor 133, and an inverter 141 or a comparator 142 may determine whether the metal line capacitor 110 is exposed based on an output voltage of the charge storing unit 130 at operation S450.

Accordingly, a method of detecting a hacking attempt according to example embodiments may detect the hacking attempt by a hacker by detecting a change of a capacitance of the metal line capacitor 110.

Figure 16:
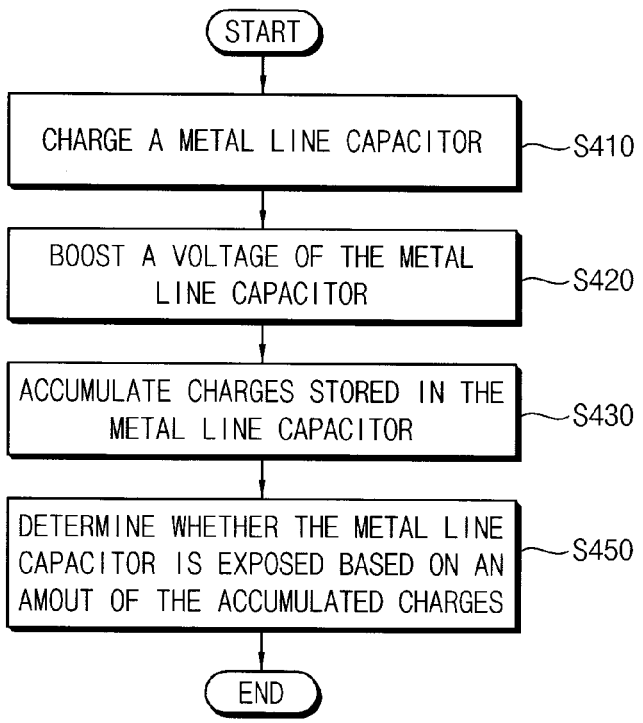
FIG. 16 is a flow chart illustrating a method of detecting a hacking attempt according to an exemplary embodiment of the present general inventive concept.

FIG. 16 is a flow chart illustrating a method of detecting a hacking attempt according to an exemplary embodiment of the preset general inventive concept.

Referring to FIGS. 10 and 16, a charge providing unit 120b may charge a metal line capacitor 110 in response to a clock signal CLK at operation S410.

The charge providing unit 120b may boost a voltage of the metal line capacitor 110 by inverting the clock signal CLK at operation S420.

A charge storing unit 130 may accumulate charges of the metal line capacitor 110 in an accumulating capacitor 133 by coupling the metal line capacitor 110 to the accumulating capacitor 133 in response to an inverted clock signal /CLK at operation S430.

The charge storing unit 130 may output a voltage to correspond to an amount of the charges accumulated in the accumulating capacitor 133, and an inverter 141 or a comparator 142 may determine whether the metal line capacitor 110 is exposed based on an output voltage of the charge storing unit 130 at operation S450.

Accordingly, a method of detecting a hacking attempt according to example embodiments may detect the hacking attempt by a hacker by detecting a change of a capacitance of the metal line capacitor 110.

Figure 17:
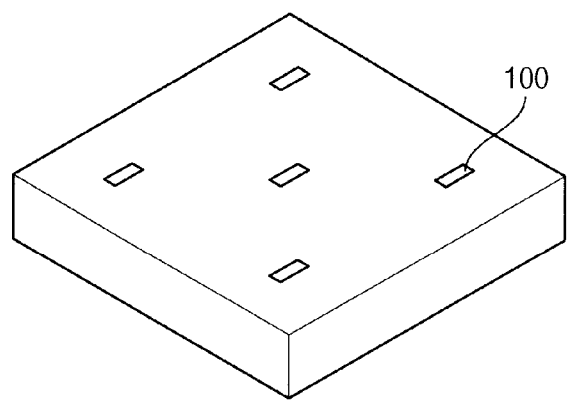
FIG. 17 is a diagram illustrating an integrated circuit according to an exemplary embodiment of the present general inventive concept.

FIG. 17 is a diagram illustrating an integrated circuit according to an exemplary embodiment of the preset general inventive concept.

Referring to FIG. 17, at least one hacking detecting device 100 may be formed in an integrated circuit 200. For example, the integrated circuit 200 may be implemented as a smart card chip, a microcontroller, a microprocessor, an application-specific integrated circuit (ASIC), etc. The hacking detecting device 100 may be the hacking detecting device 100a of FIG. 1, the hacking detecting device 100b of FIG. 10 or the hacking detecting device 100c of FIG. 13. Although FIG. 17 illustrates an example where five hacking detecting devices 100 are formed in the integrated circuit 200, the present general inventive concept is not limited thereto. The integrated circuit 200 may include one or more hacking detecting devices 100.

The integrated circuit 200 may process security data that need to be protected, such as a cryptographic key, sensitive data, a sensitive code, etc., and a hacker may attempt a hacking attack that extracts, modifies or deletes the security data by measuring signals transferred in the integrated circuit 200. The hacking detecting device 100 formed in the integrated circuit 200 may generate a detection signal DET by detecting the hacking attempt by the hacker. A processor (not illustrated) or a control logic (not illustrated) formed in the integrated circuit 200 may be reset in response to the detection signal DET. For example, if the hacking attempt is detected, the processor or the control logic may stop to process the security data, or may delete the security data stored in a memory (not shown) of the integrated circuit 200. Accordingly, the integrated circuit 200 may be protected from the hacking attempt by the hacker.

Figure 18:
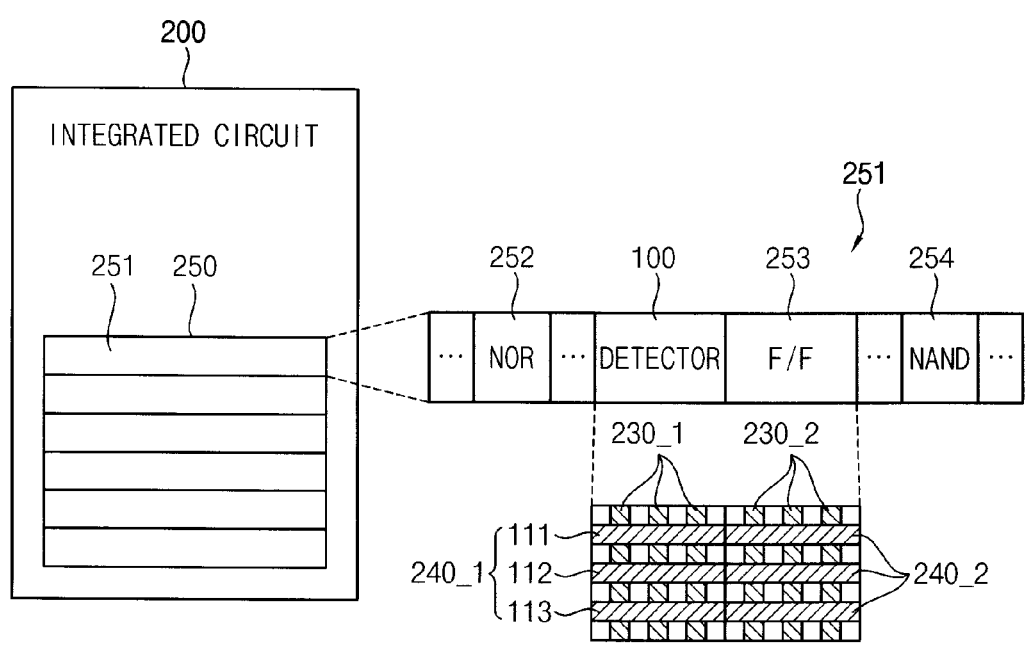
FIG. 18 is a diagram illustrating an example of a location of a hacking detecting device in an integrated circuit according to an exemplary embodiment of the present general inventive concept.

FIG. 18 is a diagram illustrating an example of a location of a hacking detecting device in an integrated circuit 200 according to an exemplary embodiment of the present general inventive concept. FIG. 18 illustrates an example where the hacking detecting device is disposed in a standard cell region of the integrated circuit.

Referring to FIG. 18, the integrated circuit 200 may include a standard cell region 250. A plurality of rows of standard cells may be formed in the standard cell region 250. For example, a row of standard cells 251 may be formed as a NOR gate 252, a flip-flop 253, a NAND gate 254, etc. using a typical CMOS standard cell process. A hacking detecting device 100 may be also formed using the typical CMOS standard cell process, and may be disposed in the standard cell region 250. Accordingly, it is not easy for a hacker to know a location of the hacking detecting device 100.

Further, a first metal line and a second metal line of a metal line capacitor included in the hacking detecting device 100 may not be distinguished from metal lines to transfer signals formed in the standard cell region 250. For example, a plurality of metal line layers 230_1 and 240_1 on the hacking detecting device 100 may have substantially the same structure as a plurality of metal line layers 230_2 and 240_2 on the flip-flop 253.

Therefore, it is not easy for a hacker to locate a metal line capacitor or a hacking detecting device from an integrated circuit even when the integrated circuit is in a closed state or an open state to expose any row of the standard cells relating the hacking detection.

For example, first and second metal lines 111 and 112 of metal lines 111, 112 and 113 included in a metal line layer 240_1 on the hacking detecting device 100 may be used a first electrode and a second electrode of the metal line capacitor. In this case, the first and second metal lines 111 and 112 may be arranged substantially in parallel with metal lines included in a metal line layer 240_2 on the flip-flop 253, and may be arranged substantially perpendicular to metal lines included in another metal line layer 240_1 on the flip-flop 253. Further, each of the first and second metal lines 111 and 112 may have a width substantially the same as that of each metal line included in the metal line layers 230_2 and 240_2 on the flip-flop 253.

As described above, the metal lines 111 and 112 used as the first electrode and the second electrode of the metal line capacitor included in the hacking detecting device 100 may not be distinguished from the metal lines for transferring signals in the standard cell region 250, and thus a hacker cannot discover the location of the hacking detecting device 100.

Figure 19:
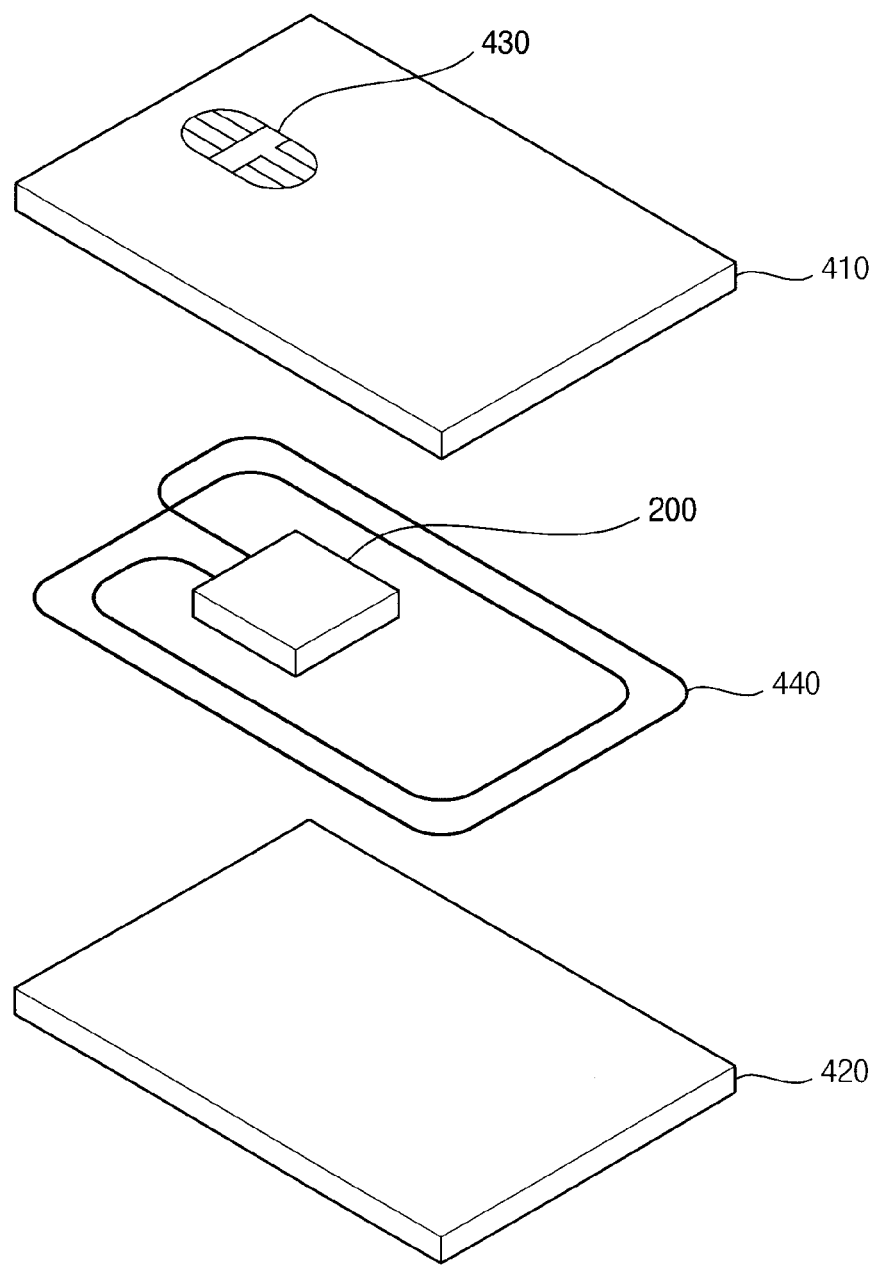
FIG. 19 is an exploded perspective view illustrating a smart card including an integrated circuit according to an exemplary embodiment of the present general inventive concept.

FIG. 19 is an exploded perspective view illustrating a smart card including an integrated circuit according to an exemplary embodiment of the present general inventive concept.

Referring to FIG. 19, a smart card 400 includes an integrated circuit 200, first and second base members 410 and 420, a contact unit 430 and an antenna 440.

The first and second base members 410 and 420 may be formed of a plastic, or the like. The integrated circuit 200 may be formed between the first and second base members 410 and 420. The integrated circuit 200 may be a smart card chip included in the smart card 400. The contact unit 430 including a plurality of pins may be formed in the first base member 410. The contact unit 430 may provide an interface to transfer data by being coupled to an external device (not shown), such as a card terminal. For example, the contact unit 430 may comply with an international standardization organization (ISO) 7816 standard. The antenna 440 may be formed as a coil between the first and second base members 410 and 420. The antenna 440 may transmit/receive a wireless signal of a predetermined frequency. For example, the antenna 440 may comply with an ISO 14443 standard. A hacking detecting device may be formed in the integrated circuit 200 included in the smart card 400, and may detect a hacking attempt.

The smart card 400 may be a hybrid card including an integrated circuit with a contact interface and an integrated circuit with a contactless interface. Although FIG. 19 illustrates an example of a combination (combo) card (i.e., a dual-interface card) including both of the contact unit 430 and the antenna 440, it is possible that the smart card 400 may include one of the contact interface and the contactless interface.

Therefore, it is not easy for a hacker to locate a metal line capacitor or a hacking detecting device from a smart card even when the smart card is in a closed state or an open state to expose any component relating the hacking detection.

Figure 20:
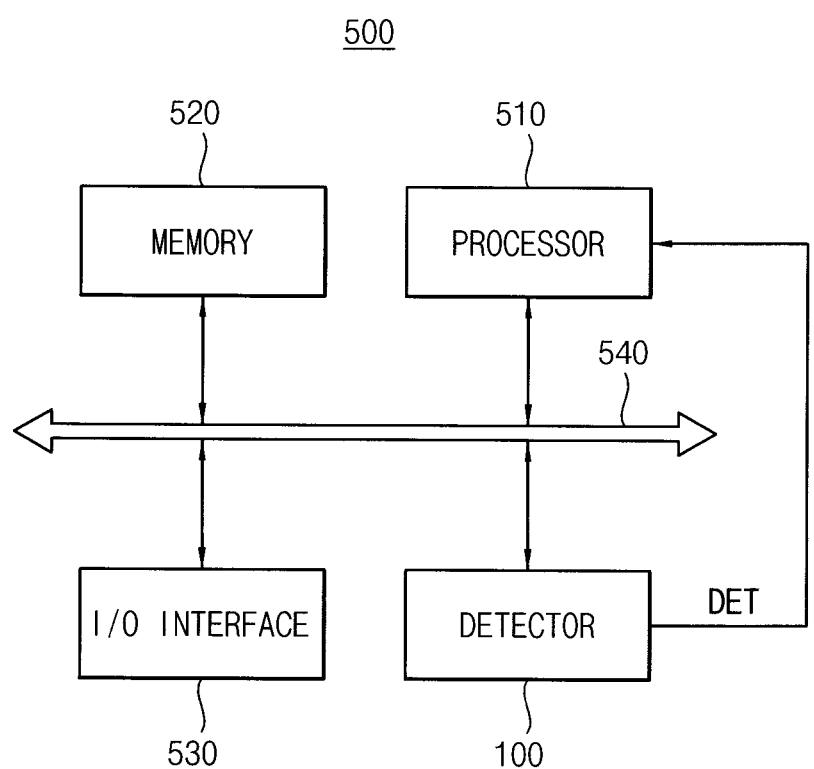
FIG. 20 is a block diagram illustrating a system including a hacking detecting device according to an exemplary embodiment of the present general inventive concept.

FIG. 20 is a block diagram illustrating a system 500 including a hacking detecting device according to an exemplary embodiment of the present general inventive concept.

Referring to FIG. 20, the system 500 includes a processor 510, a memory 520, an input/output interface 530 and a hacking detecting device 100.

The processor 510 may perform various computing functions, such as executing specific software for performing specific calculations or tasks. For example, the processor 510 may be a microprocessor, a central process unit (CPU), a digital signal processor, or the like. The processor 510 may be coupled to the memory 520 via a bus 540, such as an address bus, a control bus and/or a data bus. For example, the memory 520 may be implemented by a dynamic random access memory (DRAM), a mobile DRAM, a static random access memory (SRAM), a phase random access memory (PRAM), a ferroelectric random access memory (FRAM), a resistive random access memory (RRAM), a magnetic random access memory (MRAM) and/or a flash memory. The input/output interface 530 may provides various interfaces, such as a universal serial bus (USB) interface, an ISO 7816, ISO 14443, etc.

The hacking detecting device 100 may generate a detection signal DET by detecting a hacking attempt by a hacker. The processor 510 may be reset in response to the detection signal DET. For example, if the hacking attempt is detected, the processor 510 may stop to process data, or may delete data stored in the memory 520. Accordingly, the system 500 may be protected.

The system 500 may be a system that needs to be protected, such as a smart card, an IC card, a memory card, etc. In some embodiments, the system 500 may be a system-on-chip (SOC) where the system 500 is implemented as one chip.

The system 500 and/or components of the system 500 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (VVFP), or wafer-level processed stack package (WSP).

Figure 21:
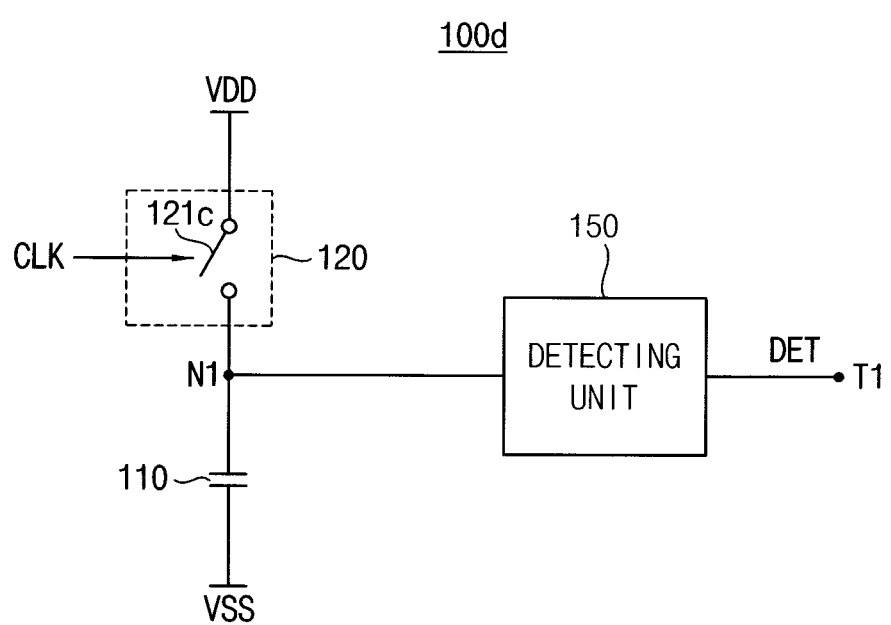
FIG. 21 is a block diagram illustrating a hacking detecting device according to an exemplary embodiment of the present general inventive concept.

Referring to FIG. 21, a hacking detecting device 100d may include a charge providing unit 120, a capacitor 110 and a detecting unit 150. The hacking detecting device 100d may include a terminal T1 to transmit a detection signal DET to an external unit thereof. The charge providing unit 120 may be similar to the charge providing unit 120a of FIG. 1 or and 120b of FIG. 10, and may include the switch 121c which is similar to the switches of FIGS. 1, 5A-5C, and 10. The charge providing unit 120 may receive a pulse signal P to operate the switch 121c. The pulse signal P may be the clock signal CLK of FIGS. 1 and 3, a system clock signal of the integrated circuit 200 of FIG. 2, 17, 18, 19, or 20, or a modified signal which is modified from the clock signal CLK or the system clock. The pulse signal P may be generated when the integrated circuit or the smart card is in communication with an external device or is in contact with an external device. It is possible that the pulse signal P can be generated between or after the communications or contacts with an external device. It is also possible that the pulse signal can be generated from a component of the substrate 210 of FIG. 2 or the processor 510 of the smart card 500 of FIG. 20.

The detecting unit 150 may include a circuit which is similar to a combination of the charge storing unit 130a and the hacking detecting unit 140a or 140b, to perform operations thereof associated with the charge providing unit 120 and the capacitor 110. However, the present general inventive concept is not limited thereto. The detecting unit 150 may be a unit to detect a characteristic of the capacitor 110 according to a charging and discharging operation associated with the charge providing unit 120. The unit may be a portion of the processor 510 of FIG. 20 or a component of the substrate 210 to control a function of the substrate 210.

The detecting unit 150 may receive a charging voltage at node N1 to be charged in the capacitor 110 during a charging period according to the pulse signal, and also receive a discharging voltage at node N1 to be discharged from the capacitor 110 during a discharging period. The detecting unit may determine whether an unauthorized access or attempt is made according to the charging voltage and the discharging voltage of the capacitor 110 as illustrated in FIG. 4, 11, or 14.

For example, the detecting unit 150 may compare the charging voltage and the discharging voltage to determine whether the capacitor is deformed or changed. It is possible that the detecting unit 150 may perform the comparison during a predetermined period of time. It is also possible that the detecting unit 150 may detect a charging or discharging characteristic with respect to a time taken to charge or discharge as illustrated in FIG. 4, 11, or 14.

It is possible that the detecting unit 150 compares a previous discharging voltage and a current discharging voltage of the capacitor 110 with respect to the charging voltage to determine the damage, deformation, or change of the capacitor 110 to correspond to an authorized access or hacking.

The detecting unit 150 may have a reset signal to periodically reset the detection or determination operation and to restart the receiving of the charging or discharging from the charge providing unit 120 and the capacitor 110 according to a predetermined period of time. The detecting unit 150 may detect changes of the charging and/or discharging of the capacitor 110 between the reset periods, and then determine an unauthorized access according to the changes.

Instead of using a reset signal in the detecting unit 150, it is possible that the charge providing unit 120 may use the pulse signal during a period of time and may periodically charge the capacitor 110 during each pulse period in the period of time. The charge providing unit 120 may repeat the periodic changing every period of time.

It is possible that the charge providing unit 120 may include a discharge portion to discharge the capacitor 110. The discharge portion may provide a ground voltage. In this case, the charge providing unit 120 may selectively connect the pulse signal to charge the capacitor 110 during the period of time and the discharge portion to discharge the capacitor during a reset period which is before or after the period of time, to the capacitor 110. Also in this case, the detecting unit 150 may receive the charging voltage during the period of time, the discharging voltage during the period of time, and another discharging voltage before or after the period of time or before or after the discharge voltage. The detecting unit may determine an authorized access or hacking according to at least one of the charging voltage, the discharge voltage and another discharge voltage with respect to a reference.

The present general inventive concept can also be embodied as computer-readable codes on a computer-readable medium to perform the above-described functions or operations. The computer-readable medium can include a computer-readable recording medium and a computer-readable transmission medium. The computer-readable recording medium is any data storage device that can store data as a program which can be thereafter read by a computer system. Examples of the computer-readable recording medium include read-only memory (ROM), random-access memory (RAM), CD-ROMs, magnetic tapes, floppy disks, and optical data storage devices. The computer-readable recording medium can also be distributed over network coupled computer systems so that the computer-readable code is stored and executed in a distributed fashion. The computer-readable transmission medium can transmit carrier waves or signals (e.g., wired or wireless data transmission through the Internet). Also, functional programs, codes, and code segments to accomplish the present general inventive concept can be easily construed by programmers skilled in the art to which the present general inventive concept pertains.

As described above, a hacking detecting device, an integrated circuit and a method of detecting a hacking attempt according to example embodiments can exactly detect whether hacking is attempted. Further, a hacking detecting device according to example embodiments may not be distinguished from standard cells, and may have a small size.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A hacking detecting device, comprising:
a metal line capacitor having a first metal line and a second metal line;
a charge providing unit configured to periodically charge the metal line capacitor;
a charge storing unit configured to accumulate charges periodically stored in the metal line capacitor; and
a hacking deciding unit configured to generate a detection signal by determining whether the metal line capacitor is exposed based on an amount of the accumulated charges,
wherein the metal line capacitor is the only metal line capacitor directly or indirectly connected to the hacking deciding unit and to the charge providing unit.

2. The hacking detecting device of claim 1, wherein the first metal line and the second metal line are formed in one layer of a plurality of layers included in an integrated circuit.

3. The hacking detecting device of claim 1, wherein the charge providing unit comprises:
a switch configured to periodically couple a first internal power supply voltage to the metal line capacitor in response to a clock signal.

4. The hacking detecting device of claim 3, wherein the charge providing unit further comprises:
an inverter configured to periodically boost a voltage of the metal line capacitor by inverting the clock signal.

5. The hacking detecting device of claim 1, wherein the charge storing unit comprises:
an accumulating capacitor configured to accumulate the charges periodically stored in the metal line capacitor;
a transfer switch configured to periodically couple the metal line capacitor to the accumulating capacitor in response to an inverted clock signal; and
a reset switch configured to discharge the accumulating capacitor in response to a reset signal.

6. The hacking detecting device of claim 1, wherein:
the charge storing unit generates an output voltage according to the amount of the accumulated charges; and
the hacking deciding unit generates the detection signal by determining whether the metal line capacitor is exposed based on the output voltage, and comprises:
an inverter to generate the detection signal by inverting the output voltage.

7. The hacking detecting device of claim 1, wherein:
the charge storing unit generates an output voltage according to the amount of the accumulated charges; and
the hacking deciding unit generates the detection signal by determining whether the metal line capacitor is exposed based on the output voltage, and comprises:
a comparator to generate the detection signal by comparing the output voltage with a reference voltage.

8. The hacking detecting device of claim 1, wherein the charge providing unit, the charge storing unit and the hacking deciding unit are formed using a CMOS process.

9. A hacking detecting device, comprising:
a metal line capacitor;
a charge providing unit to periodically charge the metal line capacitor; and
a detection unit connected to the metal line capacitor to detect a characteristic of the metal line capacitor according to a plurality of periodic charges of the metal line capacitor,
wherein the metal line capacitor is the only metal line capacitor directly or indirectly connected to the detection unit and to the charge providing unit.

10. The hacking detection device of claim 9, wherein the charge providing unit alternately charges and discharges the metal line capacitor so that the plurality of periodic charges are output from the metal line capacitor to the detection unit.

11. The hacking detecting device of claim 9, wherein:
the charge providing unit repeats supplying a potential to the metal line capacitor and terminating the supply of the potential: and
the detection unit receives the plurality of periodic charges when the charge providing unit terminates the supply of the potential to the metal line capacitor.

12. The hacking detecting device of claim 9, wherein the detection unit accumulates the plurality of periodic charges and determines the characteristic of the metal line capacitor according to the accumulated periodic charges.

13. The hacking detection device of claim 9, wherein the detection unit receives a first set of the plurality of periodic charges and periodically resets the received plurality of periodic charges to receive a second set of the plurality of periodic charges.

14. The hacking detection device of claim 9, wherein the charge providing unit periodically charges the metal line capacitor for each of a plurality of periods, and the detection unit detects the characteristic of the metal line capacitor between the periods.

15. The hacking detecting device of claim 9, wherein:
the metal line capacitor comprises a first metal line, a second metal line, and a structure disposed between the first metal line and the second metal line; and
the plurality of periodic charges are variable according to a change of the structure of the metal line capacitor with respect to a time axis.

16. The hacking detecting device of claim 9, wherein:
the metal line capacitor comprises a first metal line, a second metal line, and a structure disposed between the first metal line and the second metal line;
a set of the plurality of periodic charges represents a pattern different from a reference pattern; and
the detection unit determines the characteristic as a hacking according to the pattern and the reference pattern.

17. An integrated circuit comprising:
a plurality of metal line capacitors;
a charge providing unit to periodically charge one of the metal line capacitors; and
a detection unit connected to the one metal line capacitor to detect a characteristic change of the one metal line capacitor according to a plurality of periodic charges of the one metal line capacitor,
wherein the metal line capacitor is the only metal line capacitor directly or indirectly connected to the detection unit and to the charge providing unit.

18. The integrated circuit of claim 17, wherein the plurality of metal line capacitors have a same structure and dimension and the characteristic change corresponds to a change of the structure and dimension.

19. The integrated circuit of claim 17, wherein the charge providing unit periodically charges more than two of the metal line capacitors disposed spaced apart from each other with respect to a plain of the plurality of metal line capacitors.

20. The integrated circuit of claim 17, wherein the detection unit does not detect the characteristic of the one metal line capacitor from the other one of the plurality of metal line capacitors.

* * * * *